US 007743359B2

(12) United States Patent
Sezginer et al.

(10) Patent No.: US 7,743,359 B2
(45) Date of Patent: Jun. 22, 2010

(54) APPARATUS AND METHOD FOR PHOTOMASK DESIGN

(75) Inventors: Abdurrahman Sezginer, Los Gatos, CA (US); Roy Prasad, Los Gatos, CA (US); Chi-Song Horng, Palo Alto, CA (US); Hsu-Ting Huang, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 24 days.

(21) Appl. No.: 11/203,330

(22) Filed: Aug. 13, 2005

(65) Prior Publication Data

US 2006/0248498 A1 Nov. 2, 2006

Related U.S. Application Data

(60) Provisional application No. 60/677,104, filed on May 2, 2005.

(51) Int. Cl.
*G06F 17/50* (2006.01)
(52) U.S. Cl. .............. 716/21; 716/4; 716/19; 430/30
(58) Field of Classification Search ........... 716/19–21, 716/4; 700/98; 430/4–5, 30; 378/34–35; 382/144, 154; 250/492.22; 703/2
See application file for complete search history.

(56) References Cited

U.S. PATENT DOCUMENTS 6,563,566 B2 * 5/2003 Rosenbluth et al. .......... 355/67
6,584,609 B1 * 6/2003 Pierrat et al. ................. 716/19
6,700,095 B2 3/2004 Sandstrom et al.
6,777,146 B1 * 8/2004 Samuels ....................... 430/30
6,978,438 B1 * 12/2005 Capodieci .................... 716/21
7,043,712 B2 * 5/2006 Mukherjee et al. ........... 716/19
7,063,920 B2 * 6/2006 Baba-Ali ...................... 430/5
7,065,738 B1 * 6/2006 Kim ............................ 716/19
7,120,285 B1 * 10/2006 Spence ....................... 382/144
7,221,989 B2 * 5/2007 Prager et al. ................ 700/108
7,224,471 B2 * 5/2007 Bischoff et al. ............. 356/601
2003/0152873 A1 * 8/2003 Tainaka et al. .............. 430/313
2004/0221254 A1 * 11/2004 Cobb .......................... 716/19

(Continued)

OTHER PUBLICATIONS

Guerrieri, R. et al., "Massively Parallel Algorithms for Scattering in Optical Lithography", Sep. 1991, IEEE Transactions on Computer-Aided Design, vol. 10, No. 9, pp. 1091-1100.*

(Continued)

*Primary Examiner*—Vuthe Siek
*Assistant Examiner*—Patrick Sandoval
(74) *Attorney, Agent, or Firm*—Sheppard Mullin Richter & Hampton LLP

(57) ABSTRACT

An apparatus and method of synthesizing a photolithographic data set includes using a first computational model to calculate a first figure-of-merit for the photolithographic data set; changing a first part of the photolithographic data set to increase the first figure-of-merit; and then using a second computational model to calculate a second figure-of-merit of the photolithographic data set; and changing a second part of the photolithographic data set to increase the second figure-of-merit. The second computational model enables figure-of-merit calculations to be executed at a significantly faster execution rate than the first computational model.

33 Claims, 5 Drawing Sheets

U.S. PATENT DOCUMENTS

| | | | |
|---|---|---|---|
| 2005/0081180 A1* | 4/2005 | Kotani et al. | 716/21 |
| 2005/0086629 A1* | 4/2005 | Shin et al. | 716/21 |
| 2005/0229125 A1* | 10/2005 | Tabery et al. | 716/5 |
| 2006/0057475 A1* | 3/2006 | Liebmann et al. | 430/5 |
| 2006/0085772 A1* | 4/2006 | Zhang | 716/4 |

OTHER PUBLICATIONS

C. Mack, Inside PROLITH, p. 100-103, FINLE Technologies, Austin, Texas, 1997.

C. Mack, Inside PROLITH, Chapter 9, FINLE Technologies, Austin, Texas, 1997.

C. A. Mack, "Lithographic Simulation: A Review", KLA-Tenkor, FINLE Division, SPIE vol. 4440, pp. 59-72 (2001).

P. E. Gill, et al., Practical Optimization, Chapter 4, Elsevier, 1986).

J. Koza, Genetic Programming, MIT Press, Cambridge, MA, 1992, Chapters 5 & 6.

S. Kirkpatrick et al., "Optimization by Simulated Annealing," Science, vol. 220, No. 4598, 1983, pp. 671-680.

M. Born, et al., entitled "Principles of Optics", (Section 8.3.2, pp. 421-425 7th Edition, Cambridge University Press, 1999).

W. C. Chew, "Waves and Fields in Inhomogeneous Media", (Section 4.6.2, pp. 239-243, Van Nostrand Reinhold, 1990).

K. Ozawa et al., "Defect Printability of ArF Alternative Phase-Shift Mask: A Critical Comparison of Simulation and Experiment", (Proc. SPIE vol. 4754, p. 630-639, Aug. 2002).

K. Ozawa et al., "Defect Printability of Alteranative Phase-Shift Mask: A Critical Comparison of Simulation and Experiment", (Proc. SPIE vol. 4691, p. 1009-1020, Jul. 2002).

Y. Deng et al., "Simulation of Exposure and Alignment for Nano-imprint Lithography", (Proc. SPIE vol. 4688, p. 842-849, Jul. 2002).

Y. Deng et al., "EUV Phasse-shifting Masks and Aberration Monitors", (Proc. SPIE vol. 4688, p. 495-502, Jul. 2002).

Y. Deng, et al., "Rigorous electromagnetic simulation applied to alignment systems",(Proc. SPIE vol. 4346, p. 1533-1540, Sep. 2001).

C. Hsu et al., "LAVA, Lithography Analysis using Virtual Access", (Proc. SPIE vol. 3334, p. 197-201, Jun. 1998).

S. Hotta et al., "Effects of shifter edge topography on through focus performance", (Proc. SPIE vol. 4186, p. 827-837, Jan. 2001).

T. V. Pistor et al., "Calculating Aerial Images from EUV Masks", (Proc. SPIE vol. 3676, p. 679-696, Jun. 1999).

T. V. Pistor, "Rigorous 3D Simulation of Phase Defects in Alternating Phase-Shifting Masks", (Proc. SPIE vol. 4562, p. 1038-1050, Mar. 2002).

T. V. Pistor et al., "Bias Optimization Through Simulation for Contact Array Pattern", (SPIE vol. 5256, pp. 1017-1026, 2003).

M. J. Brukman et al., Simulation of EUV Multilayer Mirror Buried Defects, (Proc. SPIE vol. 3997, pp. 799-806, Jul. 2000).

D. Cole, et al., "Using Advanced Simulation to Aid Microlithography Development", (Proc. IEEE, vol. 89, No. 8, p. 1194-1213, Aug. 2001).

T. Cwik et al., "Scalable, finite element analysis of electromagnetic scattering and radiation. Erorr estimation and H-adaptivity", Advances in Engineering Software, 1998, 29 (3-6): pp. 289-296.

M. G. Moharam and T. K. Gaylord, "Coupled-wave analysis of reflection gratings",Applied Optics, vol. 20, No. 2, pp. 240-24, Jan. 1981.

Lifeng Li et al., "Convergence of the coupled-wave method for metallic lamellar diffraction gratings", Journal of the Optical Society of America, (JOSA A, vol. 10, No. 6, pp. 1184-1189, Jun. 1993).

K. Bubke, et al., "Investigation of Polarization Effects on new Mask Materials," (Proc. SPIE, vol. 5754, paper 55, pp. 587-598, 2005).

Lifeng Li, "Exponantially convergent and numerically efficient solution of Maxwell's equations for lamellar gratings: coment", Journal of the Optical Society of America, (JOSA A, vol. 13, No. 3, pp. 541-542, Mar. 1996).

T. Brunner et al., "Impact of resist blur on MEF, OPC and CD control", (Proc. SPIE vol. 5377, p. 141-149, May 2004).

Lifeng Li, "Multilayer modal method for diffraction gratings of arbitrary profile, depth, and permittivity", Journal of the Optical Society of America, (JOSA A, vol. 10, No. 12, pp. 2581-2591, Dec. 1993).

Lifeng Li, "Use of Fourier series in the analysis of discontinuous periodic structures", Journal of the Optical Society of America, (JOSA A, vol. 13, No. 9, p. 1870-1876, Sep. 1996).

Lifeng Li, "Periodic multilayer gratings of arbitrary shape: coment", Journal of the Optical Society of America, (JOSA A, JOSA A, vol. 13, No. 7, p. 1475-1476, Jul. 1996).

J. A. Kong, Electromagnetic Wave Theory, Section 3.4, pp. 370-403, EMW Publishing, Cambridge, MA 2000.

Konstantinos Adam, "Modeling of Electromagnetic Effects from Mask Topography at Full-Chip Scale," (Proc. SPIE 5754, paper 498, 2005).

A. Estroff, et al., "Mask induced polarization," (Proc. SPIE vol. 5377, p. 1069-1080, May 2004).

M. S. Yeung et al., "Three-Dimensional Mask Transmission Simulation Using a Single Integral Equation Method",(Proc. SPIE vol. 3334, p. 704-713, Jun. 1998).

M. G. Moharam and T. K. Gaylord, "Three-dimensional vector coupled-wave anlysis of planar-grating diffraction", Journal of the Optical Society of America (JOSA), vol. 73, No. 9, pp. 1105-1112, Sep. 1983.

* cited by examiner

US 7,743,359 B2

APPARATUS AND METHOD FOR PHOTOMASK DESIGN

RELATED APPLICATIONS

This application claims priority from and the benefit of U.S. provisional patent application Ser. No. 60/677,104, entitled "Apparatus and Method for Characterizing An Imaging System in Projection Lithography", filed May 2, 2005, and is related to U.S. utility patent application Ser. No. 11/203,329 filed Aug. 13, 2005, now issued as U.S. Pat. No. 7,519,940, entitled "Apparatus and Method for Compensating A Lithography Projection Tool"; and U.S. utility patent application Ser. No. 11/203,331, filed Aug. 13, 2005, now issued as U.S. Pat. No. 7,379,170, entitled "Apparatus and Method for Characterizing an Imaging System in Lithography Projection Tool," which related applications are incorporated herein by reference as though fully set forth and which applications are also claims priority from and the benefit of U.S. patent application Ser. No. 60/677,104. This application is further related to U.S. patent application Ser. No. 11/203,505, filed Aug. 13, 2005, now issued as U.S. Pat. No. 7,480,891, entitled "Method and Apparatus of Model-Based Photomask Synthesis"; U.S. patent application Ser. No. 11/203,522, filed Aug. 13, 2005, now issued as U.S. Pat. No. 7,506,300, entitled "Apparatus and Method for Breaking Up and Merging Polygons"; U.S. patent application Ser. No. 11/203,498 filed Aug. 13, 2005, entitled "Apparatus and Method for Segmenting Edges for Optical Proximity"; and U.S. patent application Ser. No. 12/690,791, filed Jan. 20, 2010, entitled "Apparatus and Method for Segmenting Edges for Optical Proximity Correction", all of which applications claim priority from U.S. provisional patent application Ser. No. 60/676,136, entitled "Apparatus and Method for Optical Proximity Correction," and which applications are incorporated herein by reference as though fully set forth. Elements of the inventions disclosed in these six patent applications can be used separately or in combination with each other.

BACKGROUND

There have been different kinds of systems and methods related to optical proximity correction for the design of photomasks in projection lithography. Nevertheless, there is a need for a new and improved apparatus and method for photomask design that provides for more accurate optical proximity corrections.

BRIEF SUMMARY OF THE INVENTION

An apparatus and method for photomask design includes selecting a first more critical part of a photomask layout and a second less critical part of the photomask layout and then applying optical proximity correction to the first part utilizing a Kirchhoff approximation and applying optical proximity correction to the second part utilizing another approximation which is more accurate than the Kirchhoff approximation.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein.

DETAILED DESCRIPTION OF THE PREFERRED EMBODIMENTS

A method and apparatus for photomask design is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
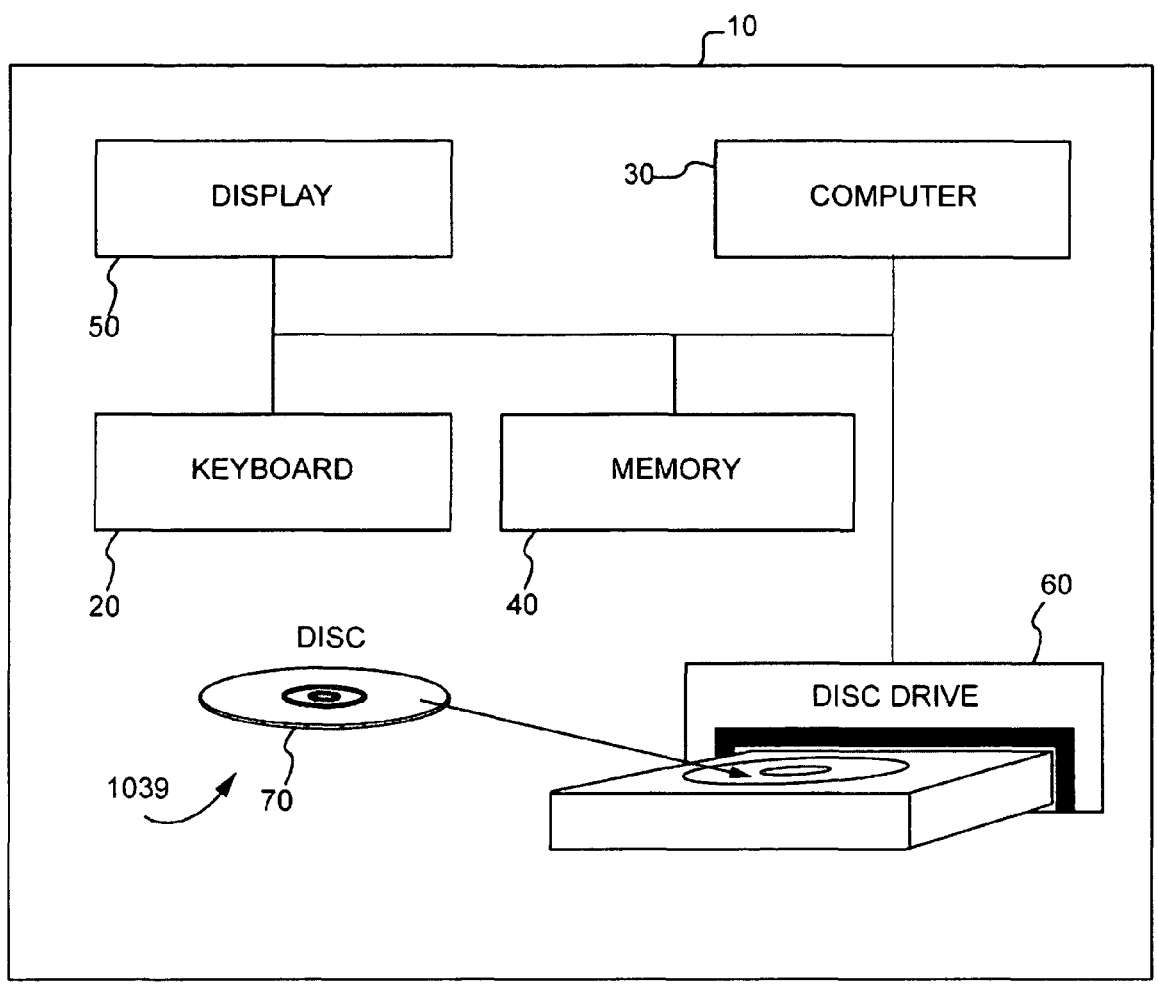
FIG. 1 is a block diagram of a computer aided design system, which is constructed in accordance with a preferred embodiment of the present invention.

Referring now to the drawings and the detailed description that follows, there is illustrated in FIG. 1, an apparatus 10, which generates a computational model of a patterning process that leads to more accurate optical proximity corrections where photomask features are comparable to or smaller than the exposure wavelength. As will be explained hereinafter in greater detail, the method 1039 that generates the computational model is provided on a computer program product 70, which is a computer usable medium that has encoded thereon computer readable codes. The computer readable codes enable a user, via the apparatus 10, which could be a CAD system, to apply the method 1039 to a photolithographic data set that corresponds to the position-dependent variations in an optical refractive index n(x, y, z) of at least a part of a photomask. In this regard, the computer readable code causes the CAD system 10 to take the following actions:

1. to select a first more critical part of a photomask layout;
2. to select a second less critical part of the photomask layout;
3. to apply optical proximity correction to the second part utilizing a Kirchhoff approximation; and
4. to apply optical proximity correction to the first part utilizing another approximation which is more accurate than the Kirchhoff approximation.

Before considering the preferred embodiments of the present invention in greater detail, it may be beneficial to briefly review the state of art with reference to model-based optical proximity correction.

To begin, very large-scale integrated circuits are patterned using sub-wavelength optical lithography where the critical dimensions of patterns are less than the wavelength of the exposing light. For example, an ArF excimer laser source of 193 nm wavelength can be used to print 65 nm-wide lines.

In sub-wavelength lithography, the photomask pattern projected on to a wafer becomes significantly distorted where the critical dimensions of the patterns are less than the wavelength of the exposing light. Model-based optical proximity correction (MOPC) is a method of synthesizing a mask pattern that will produce a predetermined target pattern on the wafer as faithfully as possible in the presence of the distortions inherent to the patterning process.

The target pattern, that is, the pattern desired on the wafer, is generated by circuit design, signal-timing, layout, and routing considerations. The target pattern is represented by a set of polygons. MOPC uses a computational model of the patterning process. Typically, the computational model includes a physical-optics calculation of image formation and a model of the blur caused by molecular diffusion in the photoresist.

MOPC starts with an initial guess of the photomask data, which is a set of polygons. For binary and attenuated-PSM (attenuated phase-shift mask) masks, the initial guess is similar to the target pattern. MOPC iteratively adjusts the polygons in the photomask data set in order to minimize some measure of the difference between the target pattern and the pattern predicted by the model. Adjusting the polygons is usually done by moving their edges. The most essential part of a computational model employed in MOPC or verification is the calculation of the optical image formation. The projection lens acts as a low-pass filter in the spatial frequency domain, thereby limiting the rate of change of the image intensity with respect to position on the image plane. This is the strongest effect that distorts the image and causes the optical proximity effect.

In prior art MOPC, light diffracted by the photomask is calculated by the Kirchhoff approximation. See for example an article by M. Born and E. Wolf, entitled, "Principles of Optics", (Section 8.3.2, 7th Edition, 1999, Cambridge University Press). According to the Kirchhoff approximation, the scattered near-field is given by equation 1:

$$E_{Scattered} = m(x,y) E_{Incident} \quad \text{Equation 1}$$

The symbol E in equation 1, denotes a component of the electromagnetic field, such as the tangential electric field as in the case of s-polarized illumination.

For transmissive photomasks, the mask function $m(x,y)$ is the local transmission coefficient of the film stack on the photomask at point $(x,y)$ in the plane of the photomask.

For reflective photomasks, such as the ones used in maskless and extreme ultraviolet (EUV) projection lithography, the mask function $m(x,y)$ is the local reflection coefficient of the film stack on the photomask at point $(x,y)$ in the plane of the photomask.

Local reflection or transmission coefficient of a film stack is calculated by ignoring any pattern in the film stack. The stack at any point $(x,y)$ is assumed to extend indefinitely in the x and y-directions. The Kirchhoff approximation is accurate for mask features that are substantially larger than the wavelength. The Kirchhoff approximation is inaccurate close to the edges and corners of all features. For mask features that are significantly smaller than the wavelength, the Kirchhoff approximation can be inaccurate everywhere on the feature. For example, a 45 nm-wide line at the wafer (1×) will map to a 180 nm-wide line on the photomask, for 4× reduction. At the ArF exposure wavelength of 193 nm, such a feature is smaller than the wavelength. The Kirchhoff approximation is sometimes called the "thin mask approximation" although the Kirchhoff approximation remains inaccurate for thin masks.

According to the Kirchhoff approximation, unlike according to more accurate solutions of Maxwell's equations, components of the scattered electromagnetic field, hence the field at the image plane, linearly depend on the mask function $m(x,y)$. The reason for this inaccuracy is that Kirchhoff approximation does not account for multiple-scattering of electromagnetic fields by features on the photomask. According to the Kirchhoff approximation, the secondary (Huygens) source induced on the mask at a point $(x,y)$ is the same whether there is an edge of the pattern in the vicinity of $(x,y)$ or not. Multiple-scattering refers to an illuminating electromagnetic wave being scattered by a pattern on the photomask, and the resulting scattered field being scattered once or more by the pattern on the photomask.

Another deficiency of the Kirchhoff approximation is that the mask reflection or transmission coefficient, $m(x,y)$, for a binary mask is independent of the angle of incidence of the illuminating wave on the photomask. The amplitudes of diffracted orders are independent of the angle of incidence on a binary grating according to the Kirchhoff approximation. In practice, diffraction efficiencies of a grating are angle-dependent. This effect is correctly captured by accurate solutions of Maxwell's Equations.

Numerical methods of solving Maxwell's equation that are more accurate than the Kirchhoff approximation are well known. These solutions are accurate in the sense that they can arbitrarily closely approximate the exact solution of Maxwell's Equations by decreasing the size of a computational mesh, hence increasing the number unknown variables or the number of computational steps.

A finite-difference time-domain method (FDTD) as more fully described in an article by W. C. Chew, entitled "Waves and Fields in Inhomogeneous Media", (Section 4.6.2, Van Nostrand Reinhold, 1990) is a technique of solving Maxwell's Equations by transforming the equations into coupled difference equations and stepping through time.

FDTD has been used for lithography simulation in the prior art. See for example the following published articles: K. Ozawa et al., Proc. SPIE Vol. 4754, p. 630-639, August 2002; K. Ozawa et al., Proc. SPIE Vol. 4691, p. 1009-1020, July 2002; Y. Deng et al., Proc. SPIE Vol. 4688, p. 842-849, July 2002; Y. Deng et al., Proc. SPIE Vol. 4688, p. 495-502, July 2002; Y. Deng, et al., Proc. SPIE Vol. 4346, p. 1533-1540, September 2001; C. Hsu et al., Proc. SPIE Vol. 3334, p. 197-201, June 1998; S. Hotta et al., Proc. SPIE Vol. 4186, p. 827-837, January 2001; T. V. Pistor et al., Proc. SPIE Vol. 3676, p. 679-696, June 1999; T. V. Pistor et al., Proc. SPIE Vol. 4562, p. 1038-1050, March 2002; T. V. Pistor et al., SPIE Vol. 5256, 2003; M. J. Brukman et al. Proc. SPIE Vol. 3997, p. 799-806, July 2000; and D. Cole et al., Proc. IEEE, Vol. 89, No. 8, p. 1194-1213, August 2001.

Another method of solving Maxwell's Equations accurately is called the boundary integral approach where the problem is reduced to solving for equivalent (Huygens) sources on the boundaries across which optical parameters of materials change. The problem is reduced to solving a surface integral equation as proposed by W. C. Chew, in the article entitled "Waves and Fields in Inhomogeneous Media", (Chap. 8, Van Nostrand Reinhold, 1990); and M. S. Yeung et al., in the Proc. SPIE Vol. 3334, p. 704-713, June 1998.

The finite elements method (FEM) is another method of solving Maxwell Equations more accurately than the Kirchhoff Approximation. For example, see T. Cwik et al., entitled "Advances in Engineering Software, 1998. 29 (3-6): p. 289-296.

Rigorous coupled wave analysis (RCWA) or coupled wave analysis, and the related modal method are especially suited for calculation of electromagnetic plane waves by periodic structures. In RCWA, the position dependent optical properties of the pattern on the photomask and the components of electromagnetic fields are expanded as Fourier series (See: M. G. Moharam and T. K. Gaylord, Applied Optics, Vol. 20 Issue 2 Page 240, January 1981; JOSA, Vol. 73, No. 9, p. 1105, September 1983; M. G. Moharam et al, JOSA A, vol. 12, no. 12, pp. 1068-1086, May 1995; Lifeng Li at al., JOSA A, Vol. 10, No. 6, p. 1184, June 1993; JOSA A, Vol. 13, No. 3, p. 541, March 1996; JOSA A, Vol. 10, No. 12, p. 2581, December 1993; JOSA A, Vol. 13, No. 9, p. 1870, Sep. 1996; JOSA A, Vol. 13, No. 7, p. 1475, Jul. 1996). A. Estroff et al. (Proc. SPIE Vol. 5377, p. 1069-1080, May 2004) and Bubke et al. (Proc. SPIE, Vol. 5754, paper 55, 2005) used RCWA to calculate diffraction of electromagnetic waves by a photomask and they pointed out the error made by using the Kirchhoff approximation.

Considering now the preferred embodiment of the present invention in greater detail, it should be noted that although in the discussions that will follow reference is made to a photomask and its associated photomask data set, the present invention is also applicable to maskless lithography, wherein the photomask is replaced by a spatial light modulator. The spatial light modulator has an array of pixels each of which can modulate light that falls on it. The pixels are controlled according to the photomask data. The spatial light modulator typically comprises an array of micro-machined mirrors. The spatial light modulator is illuminated and its image is projected by an objective on to the wafer (see: Sandstrom, et al., U.S. Pat. No. 6,700,095, 2004). In view of the foregoing, the terms "photomask data" set and "mask layout" are used synonymously and they are understood to include maskless lithography data sets. Moreover, the phrase photomask data set includes libraries.

Figure 3:
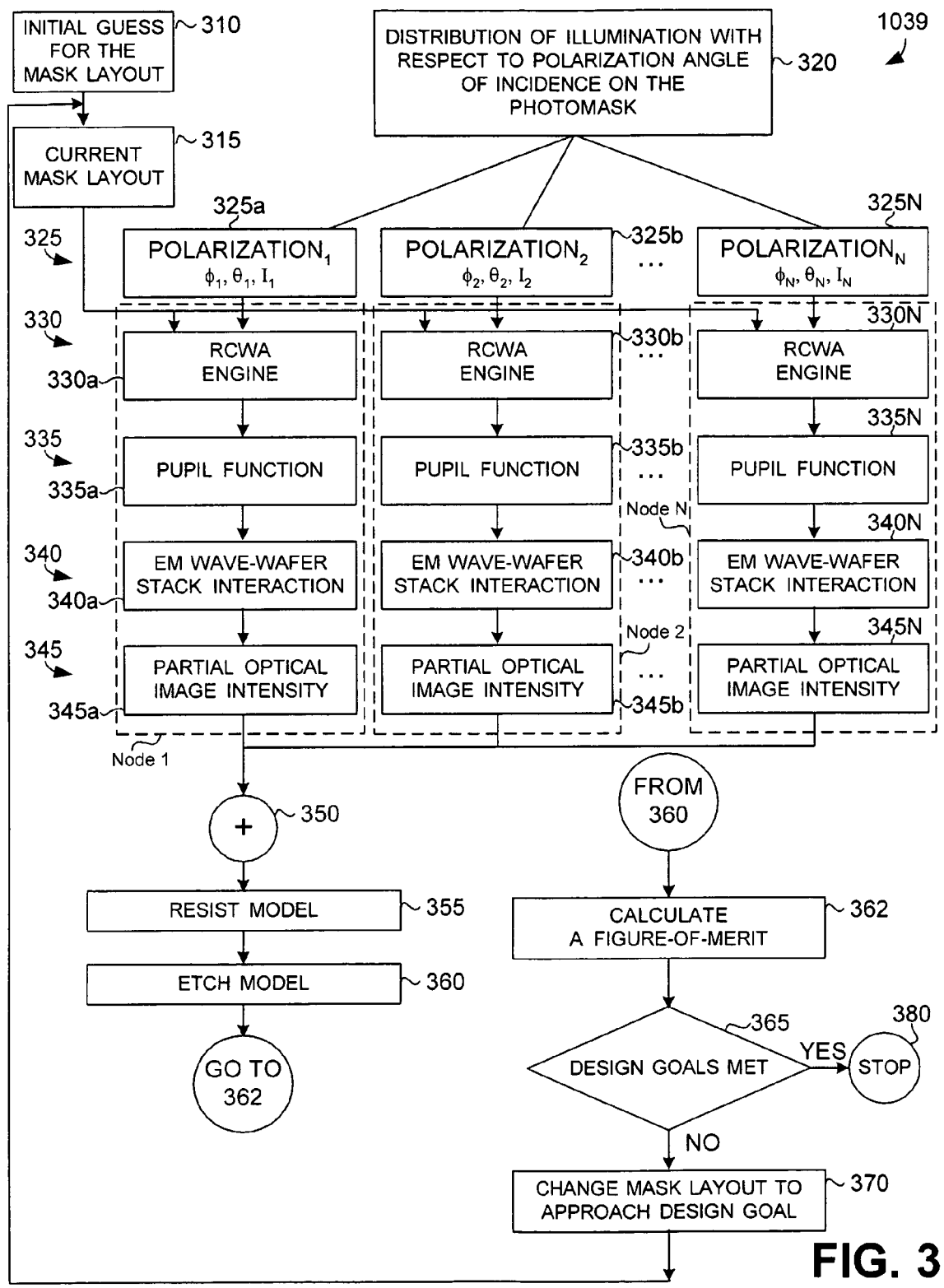
FIG. 3 is a flowchart of a method of optical proximity correction which method is in accordance with a preferred embodiment of the present invention.

Considering now the method 1039 in greater detail with reference to FIG. 3, the mask function $m(x, y)$ defined as the local transmission or reflection coefficient of the mask stack is a valid concept only within the realm of the Kirchhoff approximation. For accurate solutions of Maxwell's equations, the pattern on the mask needs to be described by a position-dependent refractive index $n(x, y, z)$. Refractive index $n(x, y, z)$ is the complex-valued refractive index of the material occupying the position $(x, y, z)$. The refractive index is related to the electrical permittivity $\epsilon(x,y,z)$ of the material at point $(x, y, z)$, and the permittivity of vacuum $\epsilon_0$, by: $n(x,y,z)=\sqrt{\epsilon(x,y,z)/\epsilon_0}$. The imaginary part of the refractive index, also called extinction coefficient, indicates how absorptive the material is. The pattern on the photomask can be described as a layered medium. The refractive index in the $j^{th}$ layer is a two-dimensional function $n_j(x,y)$. $z_j$ is at the interface between the jth and (j+1)th layer, $z_0$ is at the interface between the first layer and the substrate, and $z_L$ is at the interface between the last layer and the superstrate (air).

$$n(x, y, z) = \begin{cases} n_{SUBSTRATE} & \text{for} \quad z < z_0 \\ n_1(x, y) & \text{for} \quad z_0 < z < z_1 \\ n_2(x, y) & \text{for} \quad z_1 < z < z_2 \\ \vdots & \vdots \\ n_{AIR} & \text{for} \quad z_L < z \end{cases} \quad \text{Equation 2}$$

In Equation 2, $n_{SUBSTRATE}$ is the refractive index of the mask blank. Only one layer is needed to describe a chrome binary mask on which patterned features have vertical sidewalls:

$$n_{BINARY}(x, y, z) = \begin{cases} n_{SUBSTRATE} & \text{for} \quad z < z_0 \\ n_1(x, y) & \text{for} \quad z_0 < z < z_1 \\ n_{AIR} & \text{for} \quad z_L < z \end{cases} ;$$

$$n_1(x, y) = n_{AIR} \text{ or } n_{Cr};$$

Similarly, an attenuated-PSM mask or a chrome-less mask can be described by a single layer. Two layers are sufficient to describe an alternating aperture-PSM mask. On the first layer, $n_1(x,y)=n_{AIR}$ or $n_{GLASS}$; on the second layer, $n_2(x,y)=n_{AIR}$ or $n_{Cr}$. Sloping sidewalls can be approximated by a staircase. In that case, each physical layer on the mask is described by more than one line on the right hand side of Equation 2.

In practice, the electromagnetic field is diffracted by the features on the photomask, hence the electromagnetic field at the image plane, nonlinearly depends on $n(x, y, z)$. This fact is correctly described by accurate solutions of Maxwell's equations, which is a marked deviation from the Kirchhoff approximation.

RCWA is particularly suitable for calculating scattering of plane waves by periodic structures. Prior art MOPC does not use these techniques because these accurate numerical methods require orders of magnitude more computer resources compared to the Kirchhoff approximation. The area of a very large-scale integrated circuit (VLSI) can be 50,000λ×50, 000λ, where λ is the lithography exposure wavelength. Accurately calculating scattering by an object of this size is a formidable computational task. However, using accurate numerical methods in simulation of lithography is feasible in some applications.

Computational models of lithography are calibrated by printing and measuring test structures. Calibrating a model means determining the values of its adjustable (not a priori determined) parameters. The test structures that are used for this purpose usually have a unit cell that periodically repeats, for example, the unit cell of a gate array. In most cases, the dimension of the unit cell is a few wavelengths. A few hundred to a few thousand test structures may be used to calibrate a model. RCWA is suitable for calculating the scattering of incident waves by the periodic line-space test structures.

Memory devices such as static random access memory (SRAM), dynamic random access memory (DRAM) and flash memory have small (on the order of 1 μm×1 μm) unit cells that periodically repeat. There is economic incentive to manufacture memory devices at the highest possible bit count per unit area. The unit cell of a memory device is more tightly optimized than its supporting circuitry on the same chip. Consequently, unit cells of memory devices are most likely to benefit from optimization using a computational model such as RCWA that is accurate for small structures and that takes into account the periodic nature of the array of devices.

Critical circuits that do not consist of a periodically repeating unit cell can be modeled using RCWA. In this case, the computation assumes the pattern in the computation domain is repeated periodically outside the computation domain. The actual circuit may not repeat periodically. Then, the results of the calculation in some neighborhood of the boundary of the computation domain are discarded. A region in the center of the computation domain will be sufficiently accurate if the computation domain is larger than twice the optical range of influence. The range of optical influence is the maximum distance between two features at which the presence of one feature has a measurable effect on the field at the location of the image of the other feature. The image of a region of interest can be computed by tiling it with a plurality of overlapping computation domains. Layout of a chip can be divided into critical regions and remaining regions. The critical regions can be modeled and optimized by RCWA, and the remaining regions can be modeled and optimized using the Kirchhoff approximation. The terms critical circuit, critical cell (of the layout), and critical region will be used interchangeably in the following discussion.

Layout and routing of frequently designed circuits are done once, stored in a library of layouts, and repeatedly used.

Figure 2A:
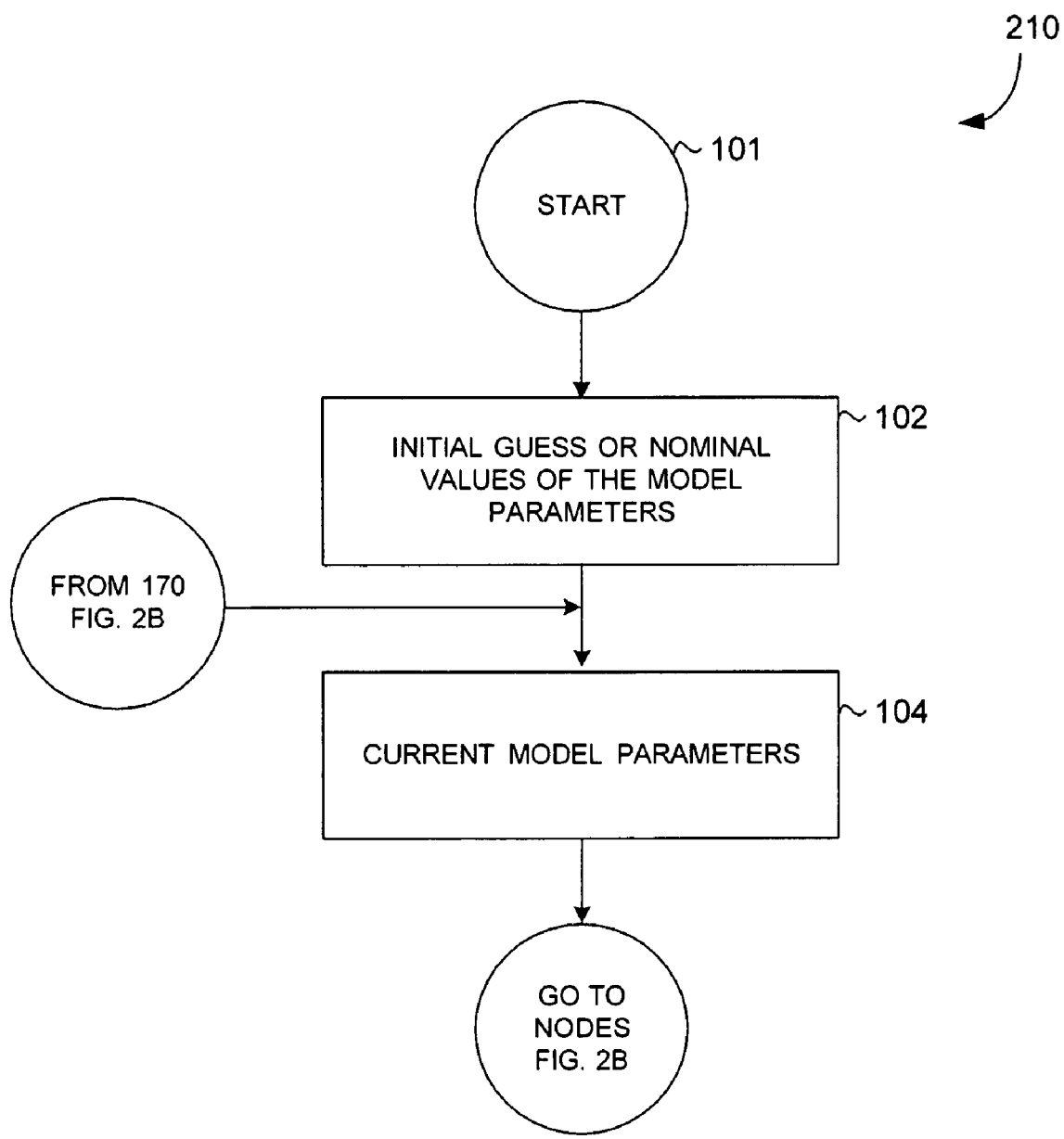
FIGS. 2A-C is a flowchart of a method for adjusting the parameters of a model of patterning process according to a set of calibration measurements.
Figure 2B:
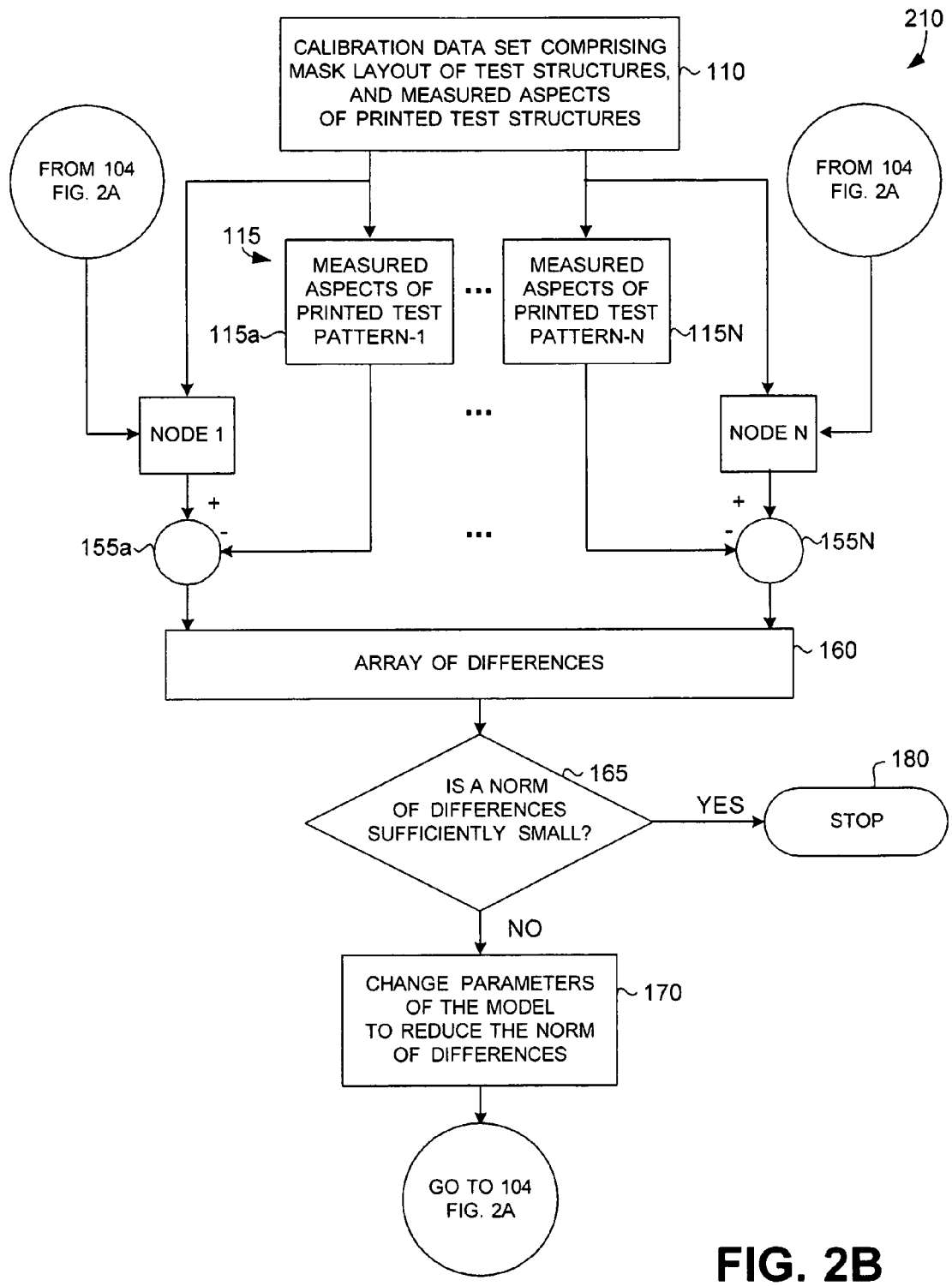
Figure 2C:
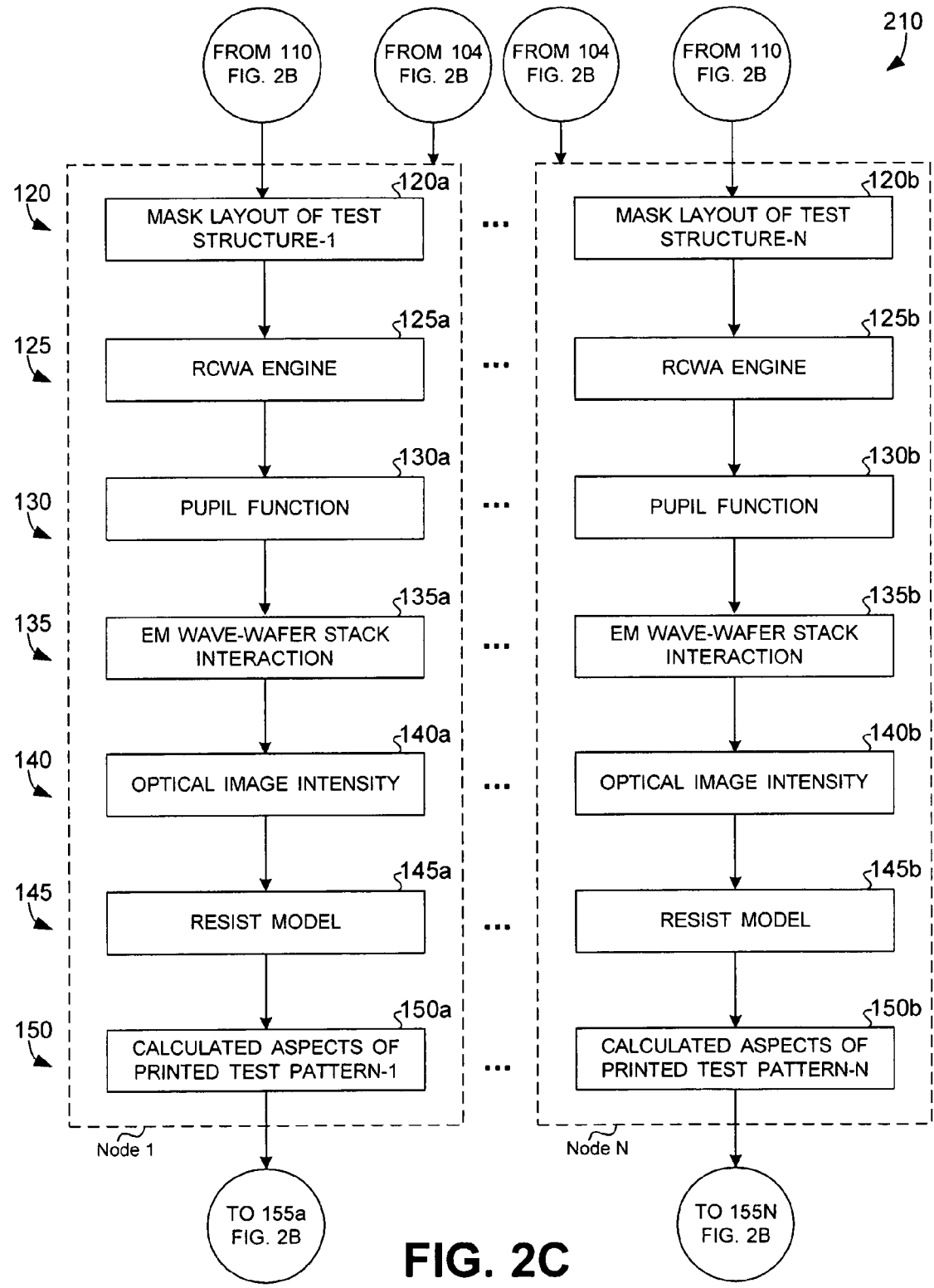

Considering now the calibration of model parameters in greater detail, FIG. 2A-2C, shows a flowchart for parallel computations to be performed on a machine having nodes or threads labeled 1, 2, ..., N. The preferred embodiment of the present invention embodies the case where there is only one node or thread (N=1). "Node" refers to one of many networked computation hardware units, each unit having at least one central processing unit CPU or digital signal processor (DSP). "Threads" refers to multiple virtual computation machines implemented on one hardware unit. In the preferred embodiment, nodes 1, 2, ..., N are physically separate, networked CPUs. The purpose of the algorithm 210 as illustrated in FIG. 2B, is to determine the best values for the adjustable parameters of a model of a patterning process.

As best seen in FIGS. 2A-2C, a method 210 of determining the best values for the adjustable parameters is illustrated, where the adjustable parameters may include coefficients of Zernike polynomials describing the lens aberrations, chromatic aberration, numerical aperture (NA) of the projection lens, pupil illumination (for example, $\sigma_{in}$ and $\sigma_{out}$ of annular illumination), and point-spread function of the resist blur.

After the method starts at step 101, an initial guess of the parameters are provided at step 102. The initial guess can be set to nominal parameters.

The algorithm iteratively updates the model parameters at step 104.

At 110, one or more test patterns on one or more test photomasks are provided. Test patterns may include any combination of lines, spaces, contacts, posts, and spaces of various widths, part of an actual circuit or circuit-like patterns. Test patterns may have binary, phase-shifted or attenuated and phase-shifted features. Test patterns are printed on wafers and aspects of the printed patterns are measured. The measured aspects can include critical dimensions such as width of lines, spaces, contacts, or posts; or distances between features; or image of a test pattern. The measurements may be taken at more than one dose and/or defocus condition. In the preferred embodiment, dimensions are measured by a CD-SEM (scanning electron microscope). In alternative embodiments, dimensions of printed test patterns are measured with electrical line width metrology (ELM), optical scatterometry, or atomic-force microscopy.

In a distribution step 120 (120a ... 120b), test structures are distributed to nodes or threads. If the number of nodes or threads (N) is less than the number of test structures, at least one node or thread repeats the following computations for multiple test structures in a sequential manner. In the preferred embodiment, dimensions of the test structures on photomask(s) are measured and provided at steps 110 and 120.

In an analysis step 125 (125a ... 125b), a rigorous coupled wave analysis (RCWA) algorithm calculates how the incident (illuminating) light is scattered by the photomask. RCWA is most efficient for periodically repeating structures. Test structures such as an array of lines, contacts, or posts have a periodically repeating unit cell; therefore, they are well suited for RCWA. In an alternative embodiment, the analysis step 125 can use other methods to accurately solving the electromagnetic scattering problem on the photomask, for example, an FDTD, FEM, or boundary integral method.

In an apply step 130 (130a ... 130b), a pupil phase and amplitude function is applied to the light that is transmitted through the projection lens system. (The method is taught in another application, U.S. Ser. No. 11/203,331, filed Aug. 13, 2005, now issued as U.S. Pat. No. 7,379,170). The reduction (or magnification) of the lens imaging is taken into account.

(See A. E. Rosenbluth et al, "Fast calculation for high numerical aperture lithography," Proc. SPIE, Vol. 5377, pp. 615-628, 2004.) It is optional to include the birefringence effects of the lens system, and the method is also taught in the Rosenbluth et al. paper.

In a calculation step 135 (135a ... 135b), the electromagnetic field inside the photoresist is calculated. In this regard the calculation step 135 comprises another RCWA calculation which takes into account underlying pattern in the stack on the wafer. In practice, a BARC (bottom anti-reflective coating) film is deposited over the underlying pattern, under the photoresist film. BARC is usually absorptive and it substantially isolates the resist from the underlying pattern. In the preferred embodiment, the underlying pattern is not taken into account, hence the calculation performed at step 135 is reduced to calculating the propagation of plane waves in a layered (planarly-stratified) medium (see: J. A. Kong, Electromagnetic Wave Theory, Section 3.4, EMW Publishing, Cambridge, Mass. 2000).

From step 135 an optical image intensity 140 (140a ... 140b) results that affects a photo-reaction. The response of the resist to the image intensity is then calculated at a calculation step 145 (145a ... 145b). An essential part of this calculation is the resist blur, which accounts for smearing of the latent image due to diffusion of molecules (C. Mack, *Inside PROLITH*, p. 100-103, FINLE Technologies, Austin, Tex., 1997; T. A. Brunner et al., Proc. SPIE Vol. 5377, p. 141-149, May 2004). The calculation step 145 embodies a model of resist dissolution in a developer solution (See: C. Mack, *Inside PROLITH*, Chapter 9, FINLE Technologies, Austin, Tex., 1997). In the preferred embodiment, a simple threshold is applied to the latent image intensity after the calculation of resist blur.

At another calculation step 150 (150a ... 150b), an aspect of the printed image is calculated. The calculated aspect can be one or more critical dimensions, differences of critical dimensions, or a resist-edge contour.

Next at step 160, an array of differences between calculated and measured aspects of the test patterns is formed. The iteration is terminated at a determination step 165 if a norm of the differences is sufficiently small, or the norm of differences can no longer be decreased. A suitable norm of the differences, $\chi$, is:

$$\chi^2 = \sum_p \sum_q \left[ \frac{CD_{CALC}(\text{Test Struct}_p, \text{Proc.Condition}_q) -}{CD_{MEAS}(\text{Test Struct}_p, \text{Proc.Condition}_q)} \right]^2 \quad \text{Equation 3}$$

where $CD_{CALC}$ and $CD_{MEAS}$ refer to calculated and measured dimensions, respectively, the index p labels test structures and the index q labels process conditions such as dose and focus.

The current set of values of the model parameters is subsequently used in optical proximity correction and verification. The iteration may be terminated at the determination step 165 if a predetermined number of iterations or computation time has been reached.

If the iteration is not terminated, the model parameters are adjusted to reduce the norm of differences at step 170 according to an optimization algorithm such as one of: Gauss-Newton, Levenberg-Marquardt, quasi-Newton, steepest-descent algorithms. (See: P. E. Gill, W. Murray, M. H. Wright, *Practical Optimization*, Chapter 4, Elsevier, 1986), genetic algorithm (See: J. Koza, *Genetic Programming*, MIT Press, Cambridge, Mass., 1992), simulated annealing (S. Kirkpatrick et al., "Optimization by Annealing," Science, Vol. 220, No. 4598, 1983).

The current model parameters are updated at an update step 104 and distributed to all nodes. In the preferred embodiment, the optimization and update steps 165, 170 and 104 are performed at a head (master) node of a computer cluster. In the preferred embodiment, patterning of different test structures is calculated in parallel. Other parallelization schemes are possible. Scattering of plane waves incident on a test structure from different directions can be calculated in parallel. Scattering of different (S and P) polarizations of illumination by a test structure can be calculated in parallel. Measured aspects of the printed test patterns 1 . . . N are obtained as illustrated at 115 (115a . . . 115N) as best seen in FIG. 2B.

Considering now the preferred method 1039 of optical proximity correction in greater detail with reference to FIG. 3, the preferred method 1039 provides for a parallel computation to be performed on a machine having nodes or threads labeled 1, 2, . . . , N. In an alternative embodiment, there is only one node or thread (N=1). In the preferred embodiment, nodes 1, 2, . . . , N are physically separate, networked CPUs. The illumination that is incident upon the photomask is represented by a discrete summation of plane waves that are incoherent with each other, each plane wave having a particular direction of incidence, polarization, and amplitude.

At step 320, the illumination conditions are specified, and a discreet set of planewave attributes 325 (325a, 325b, . . . . 325N), are generated and passed to the nodes.

Each node calculates the scattering, i.e. diffraction, of the incident plane wave by the photomask at step 330 (330a, 330b, . . . . 330N). In the preferred embodiment, the diffraction calculation is performed by the rigorous coupled wave analysis (RCWA) which explicitly takes into account that the pattern on the photomask is periodic in one or two dimensions. The result of the diffraction calculation is a set of plane waves (diffraction orders) that propagate through the projection lens. Each diffracted order maps to a particular point at the aperture, i.e., the Fourier transform plane, of the projection lens. In an alternative embodiment, the step 330 can use other methods to accurately solve the electromagnetic scattering problem on the photomask, for example, an FDTD, FEM, or boundary integral method.

At step 335 (335a, 335b, . . . 335N), an aperture phase and amplitude function is applied to the diffracted orders depending on which point they fall in the aperture of the projection lens, and the lens reduction (de-magnification) is applied to the diffracted orders by expanding the transverse component of their wave-vectors.

At step 340 (340a, 340b, . . . 340N), the interaction of the diffracted planewaves with the film stack on the wafer is calculated and the phase shift due to defocus (axial position of the wafer) is applied. In a detailed embodiment, an RCWA calculation is performed at step 340 to account for the underlying patterned layer(s) on the wafer. In the preferred embodiment, the underlying pattern is not taken into account; hence, calculation 340 is reduced to calculating the propagation of plane waves in a layered (planarly-stratified) medium.

At a calculate step 345 (345a, 345b, . . . 345N), the image intensity due to diffracted planewaves is calculated. The outputs from the calculate steps at 345a, 345b, . . . 345N at each node is an image that is formed by a planewave illumination of the photomask, which is a coherent form of illumination. The total image is obtained at step 350 by incoherently summing (adding intensities) of coherent images.

At a calculate step 355, the response of the photoresist to the optical image intensity is calculated. An essential part of this calculation is the resist blur caused by diffusion of molecules that make up the latent image. The resist model 355 includes a model of dissolution of the resist by a developer solution. In the simplest form, the dissolution model is a threshold that is applied to the latent image.

Optionally, at step 360, a model of wafer etch is applied to the resist pattern calculated at 355.

A figure-of-merit or figure-of-demerit of the mask layout is calculated at a calculate step 362. The figure-of-merit indicates how well the mask layout satisfies a design goal or a desired compromise between multiple goals. The calculation of the figure-of-merit comprises a term that is a measure of the differences between a target pattern and the wafer pattern calculated at 360 at one or more dose and defocus conditions. The calculation of the figure-of-merit may comprise a term that measures the magnitude of the image slope at the edges of the resist pattern. The image slope is available at step 355.

If the design goal is met as decided at a determination step 365, the current mask layout is stored and transmitted for mask writing and the process stops at step 380. If the design goal is not met, changes are made to the mask layout that will increase the figure of merit at step 370. The change is calculated according to a standard optimization algorithm such as: Gauss-Newton, Levenberg-Marquardt, quasi-Newton, steepest-descent (See: P. E. Gill, W. Murray, M. H. Wright, *Practical Optimization*, Chapter 4, Elsevier, 1986), genetic algorithm (See: J. Koza, *Genetic Programming*, MIT Press, Cambridge, Mass., 1992), or simulated annealing (S. Kirkpatrick et al., "Optimization by Annealing," Science, Vol. 220, No. 4598, 1983).

The current mask layout is updated at an update step 315, the new layout is distributed to the nodes 1, . . . , N, and another iteration is started and proceeds as previously described.

If the number of nodes or threads (N) is less than the number of incident (illuminating) plane waves, then at least one of the nodes or threads sequentially performs calculations provided by steps 325-345 for multiple incident plane waves.

Considering now the figure-of-merit of a mask layout in greater detail, the iteration described above maximizes a figure-of-merit, or equivalently, minimizes a figure-of-demerit of the mask layout. We encapsulate the goals of photomask design in a real-valued figure-of-demerit, which is calculated using the results of the computational model of the patterning process. Photomask design problem thus becomes equivalent to minimizing a figure-of-demerit or maximizing figure-or-merit, F.

The goals of photomask design include one or more of:
1. placing the edges of the resist pattern at the corresponding edges of a target pattern;
2. maximizing the image contrast at the resist edges thereby increasing the exposure dose latitude and immunity to flare;
3. maximizing the depth of focus, i.e., enforcing 1. and 2. for a range of focus values.

Goals 1 and 3 can be achieved by minimizing a figure-of-demerit $F_1$ with respect to the mask layout:

$$F_1 = \sum_{q=1}^{Q} \sum_{j=1}^{M} w_{jq}^2 (I(x_j, y_j; z_q) - t)^2 \qquad \text{Equation 4}$$

In Equation 4, $I(x_j, y_j; z_q)$ is the latent image intensity calculated at step 355. $I(x_j, y_j; z_q)$ is the intensity at a target point $(x_j, y_j)$ in the wafer, for a defocus value of $z_q$, which is the misplacement of the wafer in the z-direction. Note that the $(x_j, y_j; z_q)$ are coordinates in the wafer in the equations of figure-of-demerit, and should not be confused with the coordinate in the mask. The target points $(x_j, y_j)$; $j=1, \ldots, M$ are selected on the target polygons which specify the pattern desired on the wafer. In Equation 4, t denotes a threshold which is equal to the ratio: (dose-to-clear/dose). A positive photoresist dissolves if $I(x_j, y_j; z_q) > t$, and it does not dissolve if $I(x_j, y_j; z_q) < t$ at the location $(x_j, y_j)$ on the wafer when the defocus is $z_q$. The inequalities are reversed for a negative photoresist. A weighting factor $w_{jq}$ is optional in $$F_1 = \sum_{q=1}^{Q} \sum_{j=1}^{M} w_{jq}^2 (I(x_j, y_j; z_q) - t)^2. \qquad \text{Equation 4}$$

Since the squared terms in Equation 4 are summed over target points $(x_j, y_j)$; $j=1, \ldots, M$ and focus values $z_1, \ldots, z_Q$, resist edges go through all M target points, for all Q focus values if and only if $F_1 = 0$.

In practice, $F_1 = 0$ is usually not feasible; therefore the photomask is designed by minimizing $F_1$. This description embodies the special case Q=1 where Equation 4 is evaluated for a single focus value, such as the best focus, z=0. Using a single focus value reduces the computation time. The target points are points selected on the edges of the target polygons. The image intensity is band-limited with a Nyquist sampling rate of 0.25 λ/NA where λ is the exposure wavelength and NA is the numerical aperture. Since the image is band-limited, placing the target points arbitrarily densely increases computation time with little benefit. A preferred value for the spacing of target points on an edge is ~0.2 λ/NA. Not placing target points on corners of target polygons is good practice since resist edge cannot have sharp corners.

Goals 1, 2 and 3 can be achieved by minimizing $F_2$ with respect to the mask layout:

$$F_2 = \sum_{q=1}^{Q} \sum_{j=1}^{M} \frac{(I(x_j, y_j; z_q) - t)^2 + \alpha}{\left(tol_{jq} \frac{\partial I}{\partial n}(x_j, y_j; z_q)\right)^2} \qquad \text{Equation 5}$$

Minimizing $F_2$ forces the resist edge to go through the target points $(x_j, y_j)$; $j=1, M$ for focus values $z_1, \ldots, z_Q$. The image-slope $$\frac{\partial I}{\partial n}(x_j, y_j; z_q)$$

is the directional derivative of the image in the direction that is perpendicular to the target edge. The following term is the first-order estimate of the edge-placement error:

$$\text{Edge placement error at } (x_j, y_j; z_q) = \frac{I(x_j, y_j; z_q) - t}{\frac{\partial I}{\partial n}(x_j, y_j; z_q)} \qquad \text{Equation 6}$$

When the edge placement error is normalized with the edge placement tolerance $tol_{jq}$ for the $j^{th}$ target point at the $q^{th}$ defocus:

$$\text{Relative edge placement error at}(x_j, y_j; z_q) = \qquad \text{Equation 7}$$

$$\frac{I(x_j, y_j; z_q) - t}{tol_{jq} \frac{\partial I}{\partial n}(x_j, y_j; z_q)}$$

By virtue of having the image slope in the denominator, minimizing the figure-of-demerit $F_2$ enforces having a high image contrast at each target point. The optional, positive parameter α in the numerator of Equation 5 is used to emphasize the requirement of large image slope at the edges of the target polygons. A high image slope increases the dose latitude and decreases the sensitivity of the printed pattern to lens flare (scattered light). The terms in Equation 5 are summed over the target points and over a few focus settings $z_1$, $z_2, \ldots, z_Q$. Typically using two focus settings such as z=0 (best focus) and z=(depth of focus)/2 is sufficient. A single focus value such as the best focus z=0 may be used to reduce the computation time.

Minimizing F forces the resist edge to go through the target points but that does not preclude presence of resist edges where there are no target points. Without additional constraints, minimizing the figure-of-demerit in Equation 4 or Equation 5 can result in spurious resist features in large clear areas, away from the target points. It can also cause spurious holes in large resist areas away from the target points. Additional constraints may be needed when the target pattern has large clear or large opaque features:

$$I(x_j^{(c)}, y_j^{(c)}; z_q) \geq t_U > t \text{ for } (x_j^{(c)}, y_j^{(c)}), \text{ in clear areas and opaque assist features}$$

$$I(x_j^{(c)}, y_j^{(c)}; z_q) \geq t_L > t \text{ for } (x_j^{(c)}, y_j^{(c)}), \text{ in opaque areas and clear assist features} \qquad \text{Equation 8}$$

The control points $(x_j^{(c)}, y_j^{(c)})$ are placed where resist edges are not wanted, that is, anywhere other than the edges of the target polygons. In particular, control points may be placed on assist features and in between features where the process window is likely to be narrow. Constraint Equation 8 assumes a positive photoresist. For negative photoresists, the words opaque and clear are to be interchanged. The intensity safety margins $t_U$ and $t_L$ are determined by the desired dose latitude. Typical spacing of the control points is 0.25 λ/NA. The figure-of-demerit $F_1$ or $F_2$ is minimized subject to the constraints of Equation 8.

In the preferred implementation, the RCWA engine in FIGS. 2 and 3 is implemented by coding a general purpose computer 30 as will be described hereinafter in greater detail with reference to FIG. 1. Alternatively, the RCWA engine can be implemented by coding a DSP, or it can be implemented by a dedicated hardware.

Considering now the computer program product 70, in greater detail with reference to FIG. 1, the computer program product 70 is a computer usable medium that has encoded thereon computer readable codes. The computer readable codes enable a user, via the CAD system 10, to generate a computational model of a patterning process that leads to more accurate optical proximity corrections where photomask features are comparable or smaller than the exposure wavelength. In this regard, the computer program product 70 has encoded thereon computer readable program code that causes the computer 30 in one preferred method 1039 to take the following actions:

1. to select a first more critical part of a photomask layout;
2. to select a second less critical part of the photomask layout;

3. to apply optical proximity correction to the second part utilizing a Kirchhoff approximation; and
4. to apply optical proximity correction to the first part utilizing another approximation which is more accurate than the Kirchhoff approximation.

The computer readable program code also causes the computer 30 to take the following additional actions;
1. to use a first computational model for calculating a first figure-of-merit for a photolithographic data set;
2. to change a first part of the photolithographic data set to increase the first figure-of-merit;
3. to use a second computational model for calculating a second figure-of-merit where the second computational model executes faster than the first computational model; and
4. to change a second part of the photolithographic data set to increase the second figure-of-merit.

The photolithographic data set as mentioned in the preceding paragraph corresponds to position-dependent variations in the optical refractive index n (x, y, z) of at least of a part of a photomask. Also when the computer 30 uses the first computational model to calculate the first figure-of-merit, it calculates a scattering of illuminating electromagnetic waves relative to the position-dependent variations in the optical refractive index n (x, y, z).

In using the first computational model to calculate a scattering of illuminating electromagnetic waves, the first computational model calculates at least one of the following:
1. a scattered electromagnetic field that nonlinearly depends on position-dependent variations in the refractive index n (x, y, z.);
2. an electromagnetic field that is diffracted by said photomask, wherein a diffraction efficiency depends on a direction of incidence of an illuminating electromagnetic wave;
3. a multiple-scattering of illuminating electromagnetic waves by features of the photomask.

In this regard, the first computational model uses any one of the following algorithms:
a. a coupled wave analysis;
b. a boundary integral equation;
c. a finite-elements method;
d. a finite-difference method; or
e. a thin-film interference method.

In the preferred embodiment, the computer readable code has been described as being encoded on a disc 70 that can be entered into the computer memory 40 by the disc drive 60, which reads and transfers the code under computer control. However, it is contemplated that the code could be entered remotely from another computer, through a high speed cable or satellite connection, or directly from any other input device that is capable of communication with the computer 30. Moreover, although only a single computer is illustrated in FIG. 1, the use of two or more processors in the computer is clearly contemplated. For example, using a first computational model as described earlier, contemplates using a plurality of processors wherein at least two of the processors operate in parallel and where each of the processors calculate the scattering of illuminating electromagnetic waves for different sets of polarizations and directions of incidence.

One preferred method of synthesizing a photolithographic data set, comprises using a first computational model to calculate a first figure-of-merit of the photolithographic data set; changing a first part of the photolithographic data set to increase said first figure-of-merit; using a second computational model to calculate a second figure-of-merit of the photolithographic data set, wherein the second computational model executes faster than said first computational model; and changing a second part of the photolithographic data set to increase the second figure-of-merit. In this regard the first computational model substantially predicts at least one of the following effects: proximity and fogging in mask writing; mask etch; photoresist blur; photoresist develop; and wafer etch.

With reference to the preferred method described in the preceding paragraph it should be understood that at least one of: changing the first part, and changing the second part, generally comprises inserting a sub-resolution feature in the photolithographic data set.

Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

We claim:
1. A method operating on a computer of synthesizing a photolithographic data set comprising:
    partitioning by using the computer the photolithographic data set into a first part and second part based on criticality, wherein the photolithographic data set provides a target pattern that produces a wafer pattern, the wafer pattern is calculated at a given dose and defocus condition, and the first part is more critical than the second part;
    using a first computational model to calculate a first figure-of-merit of the first part, wherein the first figure-of-merit is a measure of a first difference between sections of the target pattern and the wafer pattern that correspond to the first part;
    changing the first part of the photolithographic data set to increase said first figure-of-merit;
    using a second computational model to calculate a second figure-of-merit of the second part, wherein the second computational model executes faster than said first computational model, and the second figure-of-merit is a measure of a second difference between sections of the target pattern and the wafer pattern that correspond to the second part; and
    changing the second part of the photolithographic data set to increase the second figure-of-merit;
    wherein the photolithographic data set corresponds to position-dependent variations in an optical refractive index n(x, y, z) of at least a part of a photomask; and
    wherein said operation of using a first computational model to calculate a first figure-of-merit of the photolithographic data set includes:
    using said first computational model to calculate a scattering of illuminating electromagnetic waves using a coupled wave analysis, a boundary integral equation, a finite-elements method, a finite-difference method, or a thin-film interference method.

2. The method according to claim 1, wherein said first computational model is configured to calculate a scattering of illuminating electromagnetic waves by said position-dependent variations in said optical refractive index; and
    wherein said step of using said first computational model to calculate a scattering of illuminating electromagnetic waves includes using said first computational model to calculate at least one of:
    a scattered electromagnetic field that nonlinearly depends on position-dependent variations in the refractive index n(x, y, z);

an electromagnetic field that is diffracted by said photomask, wherein a diffraction efficiency depends on a direction of incidence of an illuminating electromagnetic wave;

a multiple-scattering of illuminating electromagnetic waves by features of the photomask.

3. A method operating on a computer of synthesizing a photolithographic data set, comprising:

partitioning by using the computer the photolithographic data set into a first part and second part based on criticality, wherein the photolithographic data set provides a target pattern that produces a wafer pattern, the wafer pattern is calculated at a given dose and defocus condition, and the first part is less critical than the second part;

using a first computational model to calculate a first figure-of-merit of the first part, wherein the first figure-of-merit is a measure of a first difference between sections of the target pattern and the wafer pattern that correspond to the first part;

changing the first part of the photolithographic data set to increase said first figure-of-merit;

using second computational model to calculate a second figure-of-merit of the second part, wherein the second figure-of-merit is a measure of a second difference between sections of the target pattern and the wafer pattern that correspond to the second part;

changing a second part of the photolithographic data set to increase the second figure-of-merit;

wherein the photolithographic data set corresponds to position-dependent variations in an optical refractive index n(x, y, z) of at least a part of a photomask; and wherein said operation of using a second computational model to calculate a second figure-of-merit of the photolithographic data set includes:

using said second computational model to calculate a scattering of electromagnetic fields using a coupled wave analysis, a boundary integral equation, a finite-elements method, a finite-difference method, or a thin-film interference method.

4. The method according to claim 3, wherein said step of using a first computational model to calculate a first figure-of-merit of the photolithographic data set includes:

using said first computational model to calculate a scattering of illuminating electromagnetic waves by said position-dependent variations in said optical refractive index.

5. The method according to claim 3, wherein said step of using a first model to calculate a first figure-of-merit of the photolithographic data set includes:

using said first computational model to calculate a scattering of illuminating electromagnetic waves for a plurality of different polarizations and directions of illumination.

6. The method according to claim 5, wherein said step of using said first computational model includes;

using a plurality of processors wherein at least two of the processors operate in parallel; and wherein each processor calculates the scattering of illuminating electromagnetic waves for different sets of polarizations and directions of incidence.

7. The method according to claim 3, wherein said step of using a first computational model to calculate a first figure-of-merit of the photolithographic data set includes:

using said first computational model to calculate a scattering of electromagnetic waves by a patterned layer on a wafer.

8. The method according to claim 3, wherein said first computational model substantially predicts at least one of the following effects:

proximity and fogging in mask writing;
mask etch;
photoresist blur;
photoresist develop;
wafer etch.

9. The method according to claim 3, wherein calculating at least one of the first and the second figure-of-merit includes: calculating a measure of differences between a pattern predicted by the computational model and a target pattern.

10. The method according to claim 9, wherein said evaluation is repeated for more than one dose or defocus value.

11. The method according to claim 9, wherein said evaluation is repeated for more than one dose and defocus value.

12. The method according to claim 3, wherein calculating at least one of the first and the second figure-of-merit includes: calculating a measure of image contrast.

13. The method according to claim 3, wherein calculating at least one of the first and the second figure-of-merit includes: calculating a measure of image slope.

14. The method according to claim 3, wherein calculating at least one of the first and the second figure-of-merit includes: calculating how much a printed edge will be displaced in response to a change in exposure dose.

15. The method according to claim 3, wherein calculating at least one of the first and the second figure-of-merit includes: calculating how much a printed edge will be displaced in response to a change in defocus.

16. The method according to claim 3, wherein said first part of the photolithographic data set is a unit cell of a periodically repeating pattern.

17. The method according to claim 16, wherein said unit cell is the unit cell of a memory device.

18. The method according to claim 17, wherein said memory device is a static random access memory.

19. The method according to claim 17, wherein said memory device is a dynamic random access memory.

20. The method according to claim 17, wherein said memory device is a flash memory.

21. The method according to claim 16, wherein said unit cell is the unit cell of a gate array.

22. The method according to claim 3, wherein said first part of the photolithographic data set corresponds to a critical part of an integrated circuit.

23. The method according to claim 3, wherein at least one of changing the first part, and changing the second part, comprises:

moving a boundary between two regions on the photomask.

24. The method according to claim 23, wherein each region has a unique film stack.

25. The method according to claim 23, wherein said boundary is a polygon.

26. The method according to claim 3, wherein at least one of:

changing the first part, and changing the second part, comprises:
etching a layer in a region of the photomask.

27. The method according to claim 3, wherein at least one of:

changing the first part, and changing the second part, comprises:
inserting a sub-resolution feature in said photolithographic data set.

28. The method according to claim 3, further comprising:
determining an unknown parameter, wherein said unknown parameter is associated with at least one of the computational models.

29. The method according to claim 28, wherein said step of determining said unknown parameter includes:
providing test patterns on a photomask;
printing test patterns on a wafer by lithography;
measuring aspects of said printed patterns;
assigning an initial value to said unknown parameter;
predicting how test patterns would print according to the computational model; changing the value of said unknown parameter in a way that reduces the difference between measured and predicted aspects of printed test patterns; and
repeating the steps of predicting, and changing.

30. The method according to claim 29, wherein said step of predicting includes:
calculating scattering of illuminating electromagnetic waves for a plurality of different polarizations and directions of illumination.

31. The method according to claim 30, wherein said step of calculating includes:
using a plurality of processors within the computer wherein at least two of the processors operate in parallel; and
wherein each processor calculates scattering of illuminating electromagnetic waves for different sets of polarizations and directions of incidence.

32. The method according to claim 29, wherein said step of calculating includes:
using a plurality of processors within the computer wherein at least two of the processors operate in parallel; and
wherein each processor performs its calculation for different sets of test patterns or for different individual test patterns.

33. The method according to claim 3, further comprising:
selecting the second part of photolithographic data set such that it includes at least part of the first part of the photolithographic data set;
executing first said steps of: using a second computational model, and changing a second part of photolithographic data set; creating a changed data set;
using at least part of the changed data set as a starting point for the said step of changing a first part of the photolithographic data set.

* * * * *